(12) United States Patent
Wu

(10) Patent No.: US 11,579,840 B2
(45) Date of Patent: **\*Feb. 14, 2023**

(54) METHOD FOR ADJUSTING SOUND PLAYBACK AND PORTABLE DEVICE THEREOF

(71) Applicant: Nanning FuLian FuGui Precision Industrial Co., Ltd., Nanning (CN)

(72) Inventor: Chun-Te Wu, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/737,187

(22) Filed: May 5, 2022

(65) Prior Publication Data
US 2022/0261216 A1  Aug. 18, 2022

Related U.S. Application Data

(63) Continuation of application No. 17/153,030, filed on Jan. 20, 2021, now Pat. No. 11,354,086.

(30) Foreign Application Priority Data

May 26, 2020  (CN) .......................... 202010456254.X

(51) Int. Cl.
  *G06F 3/16* (2006.01)
  *G10L 25/51* (2013.01)

(52) U.S. Cl.
  CPC .............. *G06F 3/165* (2013.01); *G10L 25/51* (2013.01)

(58) Field of Classification Search
  CPC .................................. G06F 3/165; G06F 3/16
  See application file for complete search history.

(56) References Cited

U.S. PATENT DOCUMENTS

| 11,184,702 B2 * | 11/2021 | Frank ....................... G10L 15/28 |
| 2015/0263692 A1 * | 9/2015 | Bush ......................... H04R 3/04 |
| | | 381/103 |

FOREIGN PATENT DOCUMENTS

| CN | 102436821 B | 6/2013 |
| CN | 106504765 B | 8/2019 |
| TW | I487388 B | 6/2015 |
| TW | I520534 B | 2/2016 |
| TW | 201944251 A | 11/2019 |

* cited by examiner

*Primary Examiner* — Olisa Anwah
(74) *Attorney, Agent, or Firm* — ScienBiziP, P.C.

(57) ABSTRACT

A method for adjusting sound playback of a portable device for constancy notwithstanding different environments outputs from the portable device detectable audio signals inaudible to user and the device receives reflected audio before the portable device is actually commanded to play an audio file. A list of volume weightings for reflected audio is calculated. Before commencing playback of the audio file, the portable device obtains reference volume weightings from a list according to the current volume setting, and calculates adjustment coefficients for different frequency bands based on weightings of the reference volume list and of the reflected audio list. The audio signals of the audio file are output after adjustment. A portable device is also disclosed.

8 Claims, 5 Drawing Sheets

401

$$\begin{bmatrix} 20 & 60 & 100 & 140 & 220 & 260 \\ 70 & 210 & 350 & 490 & 770 & 910 \\ 120 & 360 & 600 & 840 & 1{,}320 & 1{,}560 \\ 170 & 510 & 850 & 1{,}190 & 1{,}870 & 2{,}210 \\ 220 & 660 & 1{,}100 & 1{,}540 & 2{,}420 & 2{,}860 \\ 270 & 810 & 1{,}350 & 1{,}890 & 2{,}970 & 3{,}510 \\ 320 & 960 & 1{,}600 & 2{,}240 & 3{,}520 & 4{,}160 \\ 370 & 1{,}110 & 1{,}850 & 2{,}590 & 4{,}070 & 4{,}810 \\ 420 & 1{,}260 & 2{,}100 & 2{,}940 & 4{,}620 & 5{,}460 \\ 470 & 1{,}410 & 2{,}350 & 3{,}290 & 5{,}170 & 6{,}110 \\ 520 & 1{,}560 & 2{,}600 & 3{,}640 & 5{,}720 & 6{,}760 \\ 570 & 1{,}710 & 2{,}850 & 3{,}990 & 6{,}270 & 7{,}410 \\ 620 & 1{,}860 & 3{,}100 & 4{,}340 & 6{,}820 & 8{,}060 \\ 670 & 2{,}010 & 3{,}350 & 4{,}690 & 7{,}370 & 8{,}710 \\ 720 & 2{,}160 & 3{,}600 & 5{,}040 & 7{,}920 & 9{,}360 \\ 770 & 2{,}310 & 3{,}850 & 5{,}390 & 8{,}470 & 10{,}010 \end{bmatrix}$$

403

$$\begin{bmatrix} 20 & 60 & 100 & 140 & 220 & 260 & 70 \\ 210 & 350 & 490 & 770 & 910 & 120 & 360 \\ 600 & 840 & 1{,}320 & 1{,}560 & 170 & 510 & 850 \\ 1{,}190 & 1{,}870 & 2{,}210 & 220 & 660 & 1{,}100 & 1{,}540 \\ 2{,}420 & 2{,}860 & 270 & 810 & 1{,}350 & 1{,}890 & 2{,}970 \\ 3{,}510 & 320 & 960 & 1{,}600 & 2{,}240 & 3{,}520 & 4{,}160 \\ 370 & 1{,}110 & 1{,}850 & 2{,}590 & 4{,}070 & 4{,}810 & 420 \\ 1{,}260 & 2{,}100 & 2{,}940 & 4{,}620 & 5{,}460 & 470 & 1{,}410 \\ 2{,}350 & 3{,}290 & 5{,}170 & 6{,}110 & 520 & 1{,}560 & 2{,}600 \\ 3{,}640 & 5{,}720 & 6{,}760 & 570 & 1{,}710 & 2{,}850 & 3{,}990 \\ 6{,}270 & 7{,}410 & 620 & 1{,}860 & 3{,}100 & 4{,}340 & 6{,}820 \\ 8{,}060 & 670 & 2{,}010 & 3{,}350 & 4{,}690 & 7{,}370 & 8{,}710 \\ 720 & 2{,}160 & 3{,}600 & 5{,}040 & 7{,}920 & 9{,}360 & 770 \\ 2{,}310 & 3{,}850 & 5{,}390 & 8{,}470 & 10{,}010 & \text{NaN} & \text{NaN} \end{bmatrix}$$

405

$$\begin{bmatrix} 20 & 60 & 70 & 100 & 120 & 140 & 170 \\ 210 & 220 & 220 & 260 & 270 & 320 & 350 \\ 360 & 370 & 420 & 470 & 490 & 510 & 520 \\ 570 & 600 & 620 & 660 & 670 & 720 & 770 \\ 770 & 810 & 840 & 850 & 910 & 960 & 1{,}100 \\ 1{,}110 & 1{,}190 & 1{,}260 & 1{,}320 & 1{,}350 & 1{,}410 & 1{,}540 \\ 1{,}560 & 1{,}560 & 1{,}600 & 1{,}710 & 1{,}850 & 1{,}860 & 1{,}870 \\ 1{,}890 & 2{,}010 & 2{,}100 & 2{,}160 & 2{,}210 & 2{,}240 & 2{,}310 \\ 2{,}350 & 2{,}420 & 2{,}590 & 2{,}600 & 2{,}850 & 2{,}860 & 2{,}940 \\ 2{,}970 & 3{,}100 & 3{,}290 & 3{,}350 & 3{,}510 & 3{,}520 & 3{,}600 \\ 3{,}640 & 3{,}850 & 3{,}990 & 4{,}070 & 4{,}160 & 4{,}340 & 4{,}620 \\ 4{,}690 & 4{,}810 & 5{,}040 & 5{,}170 & 5{,}390 & 5{,}460 & 5{,}720 \\ 6{,}110 & 6{,}270 & 6{,}760 & 6{,}820 & 7{,}370 & 7{,}410 & 7{,}920 \\ 8{,}060 & 8{,}470 & 8{,}710 & 9{,}360 & 10{,}010 & \text{NaN} & \text{NaN} \end{bmatrix}$$

402

$$\begin{bmatrix} 0.786 & 0.148 & 0.237 & 0.012 & 0.214 & 0.123 \\ 0.134 & 0.145 & 0.348 & 0.245 & 0.103 & 0.003 \\ 0.169 & 0.247 & 0.103 & 0.175 & 0.347 & 0.032 \\ 0.372 & 0.470 & 0.172 & 0.072 & 0.029 & 0.103 \\ 0.247 & 0.202 & 0.169 & 0.247 & 0.103 & 0.175 \\ 0.348 & 0.245 & 0.103 & 0.003 & 0.202 & 0.169 \\ 0.145 & 0.348 & 0.245 & 0.103 & 0.003 & 0.169 \\ 0.470 & 0.172 & 0.072 & 0.169 & 0.247 & 0.103 \\ 0.343 & 0.202 & 0.169 & 0.145 & 0.348 & 0.245 \\ 0.472 & 0.003 & 0.202 & 0.169 & 0.247 & 0.103 \\ 0.175 & 0.347 & 0.032 & 0.245 & 0.103 & 0.275 \\ 0.103 & 0.175 & 0.470 & 0.172 & 0.072 & 0.200 \\ 0.347 & 0.032 & 0.202 & 0.169 & 0.247 & 0.103 \\ 0.572 & 0.202 & 0.169 & 0.202 & 0.169 & 0.247 \\ 0.245 & 0.103 & 0.175 & 0.347 & 0.032 & 0.139 \\ 0.202 & 0.169 & 0.247 & 0.245 & 0.103 & 0.003 \end{bmatrix}$$

404

$$\begin{bmatrix} 0.786 & 0.148 & 0.237 & 0.012 & 0.214 & 0.123 & 0.134 \\ 0.145 & 0.348 & 0.245 & 0.103 & 0.003 & 0.169 & 0.247 \\ 0.103 & 0.175 & 0.347 & 0.032 & 0.372 & 0.470 & 0.172 \\ 0.072 & 0.029 & 0.103 & 0.247 & 0.202 & 0.169 & 0.247 \\ 0.103 & 0.175 & 0.348 & 0.245 & 0.103 & 0.003 & 0.202 \\ 0.169 & 0.145 & 0.348 & 0.245 & 0.103 & 0.003 & 0.169 \\ 0.470 & 0.172 & 0.072 & 0.169 & 0.247 & 0.103 & 0.343 \\ 0.202 & 0.169 & 0.145 & 0.348 & 0.245 & 0.472 & 0.003 \\ 0.202 & 0.169 & 0.247 & 0.103 & 0.175 & 0.347 & 0.032 \\ 0.245 & 0.103 & 0.275 & 0.103 & 0.175 & 0.470 & 0.172 \\ 0.072 & 0.200 & 0.347 & 0.032 & 0.202 & 0.169 & 0.247 \\ 0.103 & 0.572 & 0.202 & 0.169 & 0.202 & 0.169 & 0.247 \\ 0.245 & 0.103 & 0.175 & 0.347 & 0.032 & 0.139 & 0.202 \\ 0.169 & 0.247 & 0.245 & 0.103 & 0.003 & \text{NaN} & \text{NaN} \end{bmatrix}$$

406

$$\begin{bmatrix} 0.786 & 0.148 & 0.134 & 0.237 & 0.169 & 0.012 & 0.372 \\ 0.145 & 0.214 & 0.247 & 0.123 & 0.348 & 0.145 & 0.348 \\ 0.247 & 0.470 & 0.343 & 0.472 & 0.245 & 0.470 & 0.175 \\ 0.103 & 0.103 & 0.347 & 0.202 & 0.572 & 0.245 & 0.103 \\ 0.202 & 0.245 & 0.175 & 0.172 & 0.003 & 0.348 & 0.169 \\ 0.172 & 0.072 & 0.202 & 0.347 & 0.103 & 0.003 & 0.247 \\ 0.032 & 0.347 & 0.245 & 0.175 & 0.072 & 0.032 & 0.029 \\ 0.003 & 0.202 & 0.169 & 0.103 & 0.103 & 0.103 & 0.169 \\ 0.202 & 0.103 & 0.169 & 0.032 & 0.470 & 0.175 & 0.145 \\ 0.202 & 0.202 & 0.169 & 0.169 & 0.169 & 0.003 & 0.175 \\ 0.245 & 0.247 & 0.172 & 0.247 & 0.169 & 0.169 & 0.348 \\ 0.202 & 0.103 & 0.347 & 0.247 & 0.245 & 0.245 & 0.103 \\ 0.103 & 0.072 & 0.275 & 0.247 & 0.169 & 0.200 & 0.032 \\ 0.103 & 0.103 & 0.247 & 0.139 & 0.003 & \text{NaN} & \text{NaN} \end{bmatrix}$$

FIG. 4

METHOD FOR ADJUSTING SOUND PLAYBACK AND PORTABLE DEVICE THEREOF

FIELD

The subject matter herein generally relates to digital processing technologies.

BACKGROUND

The volume and clarity of a portable device playing music can change significantly if it is placed on a different surface or type of surface, or once it is carried into a different room. Achieving automatic adjustment of sound reproduction according to the surface and the environment in which the portable device is placed is problematic.

BRIEF DESCRIPTION OF THE DRAWINGS

Implementations of the present technology will now be described, by way of embodiment, with reference to the attached figures, wherein:

FIG. 4 is a schematic diagram of one embodiment of matrix operation of the method.

DETAILED DESCRIPTION

Figure 1:
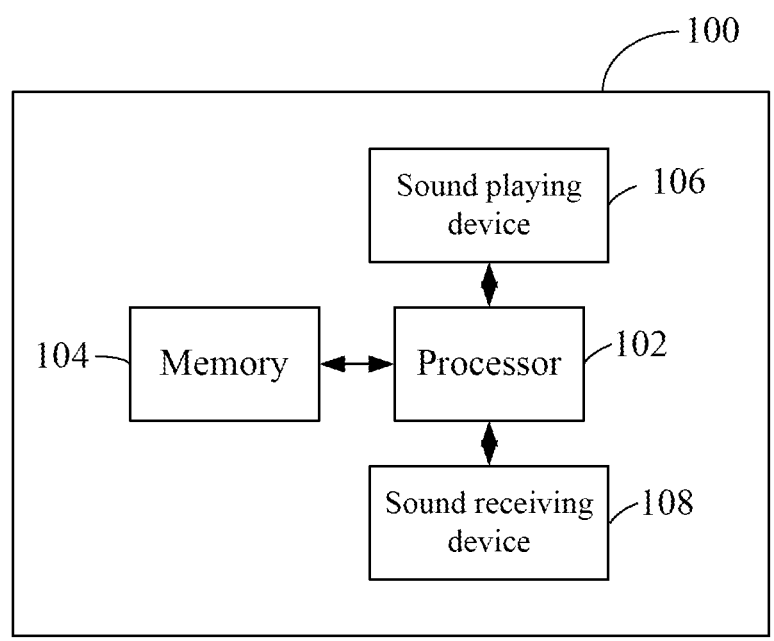
FIG. 1 is a block diagram of one embodiment of a portable device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

References to "an" or "one" embodiment in this disclosure are not necessarily to the same embodiment, and such references mean "at least one".

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series, and the like.

FIG. 1 illustrates a portable device (portable device 100) which can output sound, according to an embodiment. The portable device 100 may be a portable device capable of running applications, such as a mobile phone, a tablet, a set-top box, a multimedia player, and a smart speaker. The portable device 100 comprises a processor 102, a memory 104, a sound playing device 106, and a sound receiving device 108. The processor 102 is electrically coupled to the memory 104, the sound playing device 106, and the sound receiving device 108. The processor 102 may be a microcontroller, a microprocessor, a complex instruction set arithmetic microprocessor, a reduced instruction set arithmetic microprocessor, an ultra-long instruction set microprocessor, an ultra-parallel instruction set arithmetic microprocessor, and a digital signal processor or other circuits with computational processing capabilities. The processor 102 is configured to execute or process instructions, data, and computer programs stored in the memory 104. The memory 104 comprises a read-only memory (ROM), a random access memory (RAM), a magnetic storage medium device, a optical storage medium device, a flash memory device, an electrical, optical or other physical/tangible (e.g., non-transitory) computer-readable storage medium device, used to store one or more computer programs that control the operation of the portable device 100, and are executed by the processor 102. The sound playing device 106 may be any device suitable for playing sound according to digital signals, such as, but not limited to, a loudspeaker. The sound receiving device 108 may be any device suitable for receiving sound, such as, but not limited to, a microphone.

In one embodiment, the portable device 100 further comprises at least one sensor (not shown in FIG. 1), comprising but not limited to a motion sensor, a light sensor, and a proximity sensor.

Figure 2:
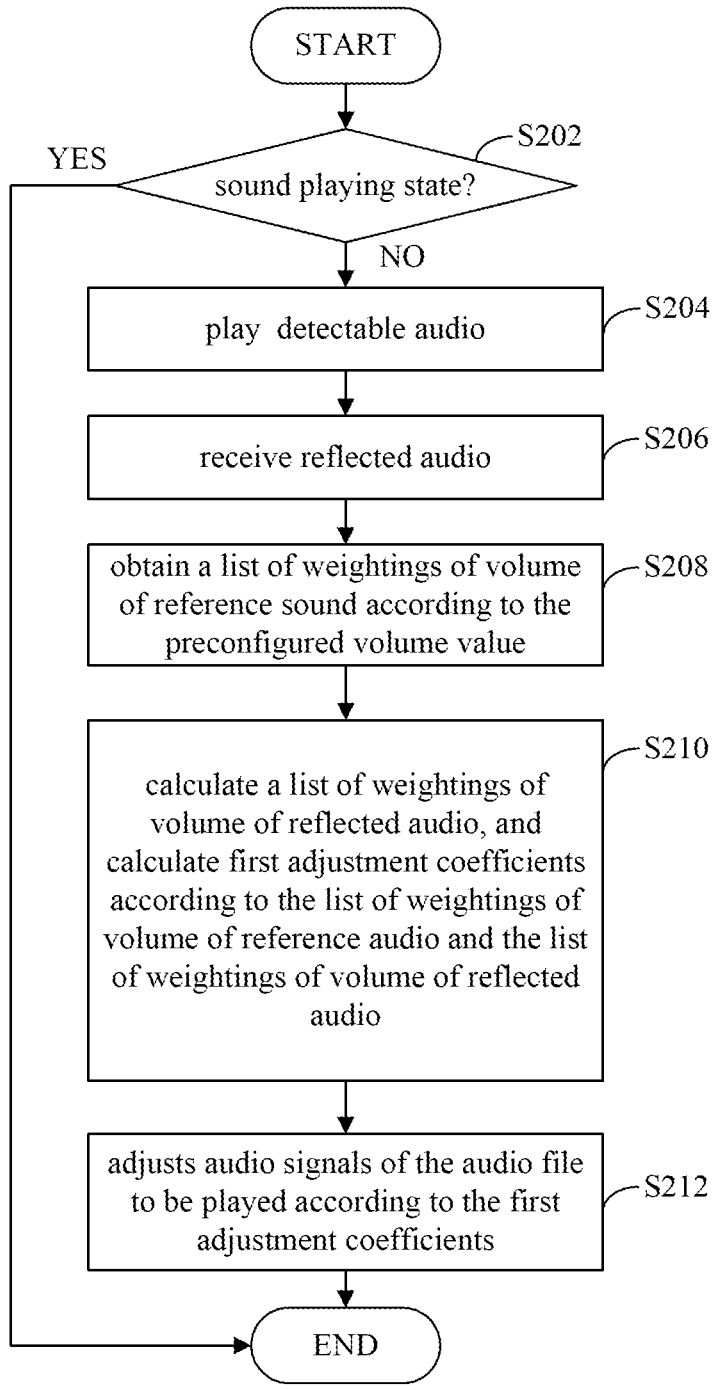
FIG. 2 is a flow chart of one embodiment of a method for adjusting the output of sound to achieve optimal reproduction.

FIG. 2 illustrates a method for adjusting sound output for optimal reproduction, according to an embodiment. The method is applied in the portable device 100 and is executed by the processor 102 and stored in the memory 104 to perform the following steps:

Step S202, the portable device 100 determines whether it is in a sound playing state. If the portable device 100 determines that it is in the sound playing state, in order not to affect the user's listening experience (such as the output of sound are changed suddenly), the process ends and no sound playing adjustment is performed. Otherwise, if the portable device 100 determines that it is not in the sound playing state, step S204 is executed.

Step S204, the portable device 100 controls the sound playing device 106 to play detectable audio signals. In one embodiment, the detectable audio signals are a plurality of repetitive waveforms with frequency changes, comprising sawtooth, triangular, and sine waveforms. In one embodiment, the detectable audio signals may be a plurality of triangular waveforms that cannot be heard by human ears but is detectable by the sound receiving device 108.

Figure 3:
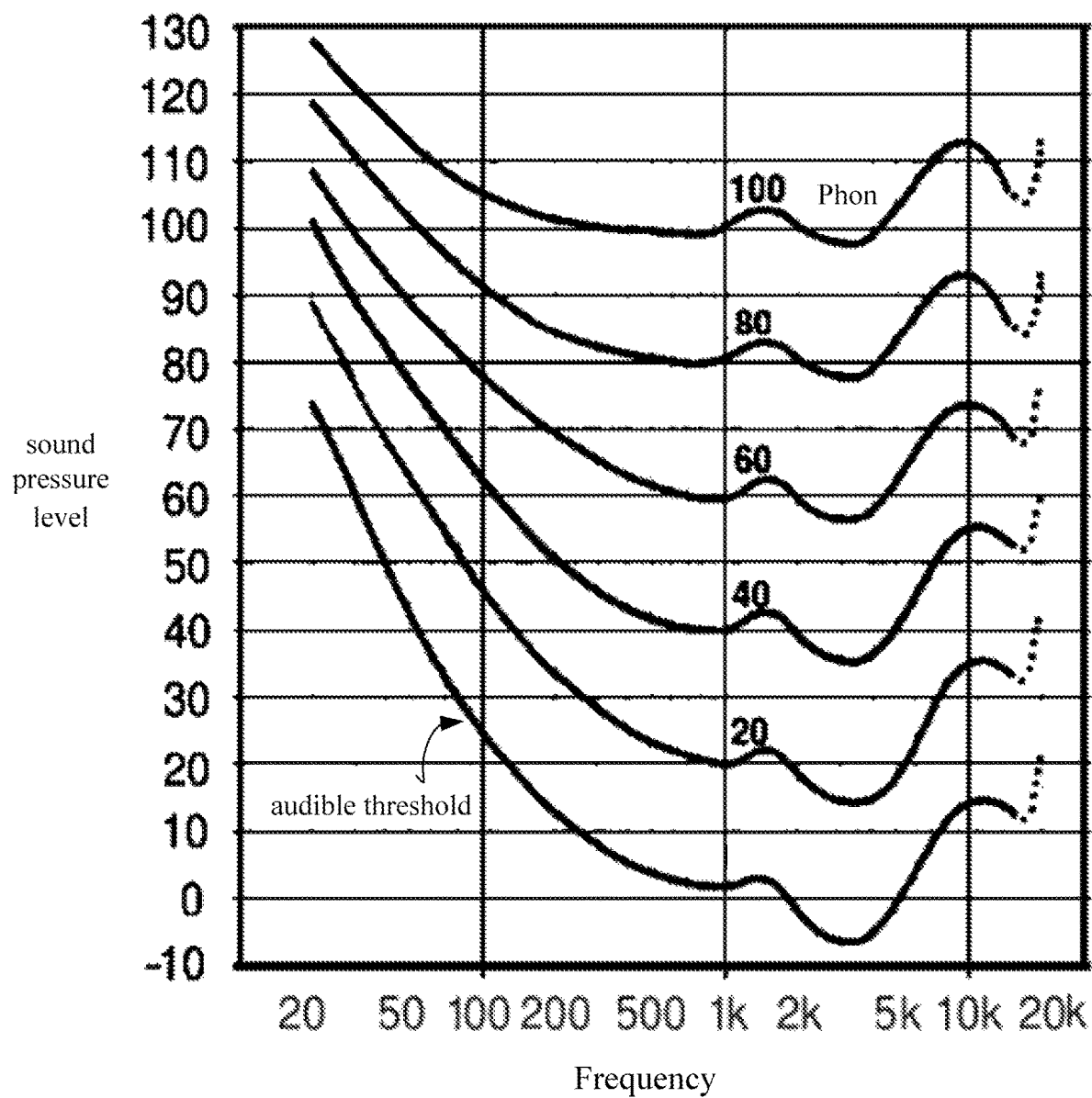
FIG. 3 is a schematic diagram of one embodiment of contours of equal loudness of the method for adjusting the sound output.

The sound frequency that humans can perceive has a certain range, and the frequency range that most people can hear is between 20 Hz and 20 KHz. However, the perception of human hearing for all frequencies is not linear, but follows an equal loudness contour. For example, FIG. 3 shows equal loudness contours perceived by the human ear, where the Y axis represents the actual sound pressure level (SPL) in decibels (dB-SPL), and the X axis represents different frequencies in hertz (Hz). The unit of (also known as sound or volume) is the Phon. Zero phons represents the quietest loudness that human ears can hear, which is also called the audible threshold. Sounds below the audible threshold are inaudible to human ears. The various loudness contours shown in FIG. 3 show a measurement at every 20 Phons as the arbitrary unit of measurement, showing the SPL required for sounds of different frequencies to cause the same loudness. Loudness is mainly determined by the SPL, increasing the SPL increases the loudness. But the loudness of the sound also depends on the frequency and is not solely determined by the SPL. As shown in FIG. 3, for a frequency of 20 Hz, an SPL of 70 decibels is required for the human ear to hear sound at this frequency, but for 3 KHz, an SPL of −5 decibels is enough for the human ear to hear it.

In one embodiment, the equal loudness contours are stored in the memory 104, the contours comprise a mapping relationship between loudness level, frequency, and sound pressure levels. In order that the detectable triangular audio signals are inaudible to a user of the portable device 100, the processor 102 may look up the equal loudness contours, and adjust the SPL of the detectable audio signals according to the equal loudness contours. The portable device 100 makes the sound pressure level lower than the audible threshold of the equal loudness contours, so that human ears are not able to hear the detectable audio signals played out by the sound playing device 106. According to the auditory characteristics of the human ear, the frequency span resolution capability at the intermediate frequency or low frequency is greater than when it is at the high frequency. According to actual measurement, the resonance frequency of the space and surrounding objects where the portable device 100 is placed is below 10 KHz. To suit the characteristics of human hearing, the frequency bands from 20 Hz to 10 KHz are divided into m frequency bands based on frequency logarithm, for example, 13 frequency bands. The fundamental frequency of the detectable audio signals is preset to increase gradually from 20 Hz to 770 Hz, divided into n frequency groups. For example, there are 16 frequency groups, and the triangular waveform is composed of fundamental frequency sine waves to the 11th harmonic, so the detectable audio signals can detect the frequency domain characteristics of a reflected sound wave at the highest 10 KHz. In one embodiment, the processor 102 can control the sound playing device 106 to sequentially play n frequency groups of detectable audio signals with different frequencies, from low frequency to high frequency.

Step S206, the portable device 100 receives the reflected audio through the sound receiving device 108. Some of then frequency groups of detectable audio signals played in step S204 arrive directly at the sound receiving device 108 through air propagation, and the other part is formed by air propagation after being scattered by objects in the room or other environment. After reflection of the waves, the other part of detectable audio signals arrive at the sound receiving device 108. The sound receiving device 108 receives and can superimpose audio signals of the direct output and the reflected wave sounds, and the sound receiving device 108 then converts the received audio into the n frequency groups of reflected audio waves.

Step S208, the portable device 100 obtains a list of weightings of volume of reference audio according to the preconfigured volume value. In one embodiment, before the portable device 100 is shipped from the manufacturer, the list of weightings is pre-stored corresponding to different volume values that can be set by a user through a user interface of the portable device 100. In one embodiment, the portable device 100 may obtain reference audio corresponding to different volume values in a laboratory before shipping from the manufacturer. In one embodiment, the reference audio is the audio received by the sound receiving device 108 after the portable device 100 has played the detectable audio in a free space. In one embodiment, the detectable audio for a specific volume value comprise 16 frequency groups of triangular sound waves from low frequency to high frequency. After the sound playing device 106 plays the detectable audio in the free space, the sound receiving device 108 receives the reference audio, which is the detectable audio reflected and sent back. Taking the fundamental frequency amplitude of each frequency group of the reference audio as 100%, the portable device 100 calculates 6 audio spectrum intensities of the reference audio for each frequency group and obtains a total of 16×6 audio spectrum intensities which form a reference audio intensity matrix with a dimension of 16×6. Then, the 16×6 detectable audio frequency matrix (401 in FIG. 4) and the reference audio intensity matrix (402 in FIG. 4) are respectively converted into dimensions corresponding to m frequency bands. In this embodiment, the 16×6 matrix is converted into a matrix with dimensions of 13×7, that is, m is set at 13, and the insufficient or lacking matrix element part is filled with a special value NaN (not a number) or a minimum value. The converted detectable audio frequency matrix is 403 in FIG. 4, and the converted reference audio intensity matrix is 404 in FIG. 4. The detectable audio frequency matrix after dimension conversion is scanned in rows and columns, and the matrix elements are sorted in ascending powers according to the element values, as 405 shows in FIG. 4. At the same time, the matrix elements in the reference audio intensity matrix are reordered, as 406 shows in FIG. 4. The portable device 100 then calculates the square root of each matrix element in each column and sums them, calculates a root mean square for each sum to obtain 13 root mean square values, these being used as the volume weighting in the list of weightings of volume of the reference audio.

Step S210, the portable device 100 calculates and obtains a list of weightings of volume of the reflected audio, and calculates first adjustment coefficients of different frequency bands according to the list of the reference audio and the list of the reflected audio in terms of weightings of volume.

In one embodiment, the method for calculating and obtaining the list of weightings of volume of the reflected audio signals is the same as the method for calculating and obtaining the list of weightings of volume of the reference audio. In this embodiment, taking the fundamental frequency amplitude of each frequency group of the reflected audio as 100%, the portable device 100 can calculate 6 audio spectrum intensities of the reflected audio for each frequency group and obtain a total of 16×6 audio spectrum intensities which form a reflected audio intensity matrix with a dimension of 16×6. Then, the 16×6 detectable audio frequency matrix and the reflected audio intensity matrix are respectively converted into dimensions corresponding to m frequency bands. In this embodiment, the 16×6 matrix is converted into a matrix with a dimension of 13×7, that is, m is set at 13, and the lacking matrix element part is filled with a special value NaN or a minimum value. The detectable audio frequency matrix after dimension conversion is scanned in rows and columns, and the matrix elements are sorted in ascending powers according to the element values. At the same time, the matrix elements in the reflected audio intensity matrix are also reordered according to their detectable audio frequencies. The square root of each matrix element in each column is found and summed, and a root mean square for each sum is calculated, to obtain 13 root mean square values which are used as the weightings in the list of weightings of volume of the reflected audio.

In this embodiment, the method for calculating the first adjustment coefficients of the different frequency bands is that the ratio of each element in the list of weightings of volume of the reference audio signals to each element in the list of weightings of volume of the reflected audio signals is calculated, and a total of 13 ratios thereby obtained. The 13 ratios are used as the first adjustment coefficients for 13 different frequency bands.

Step S212, the portable device 100 receives an audio file to be played, adjusts audio signals of the audio file according to the first adjustment coefficients corresponding to the different frequency bands, and then outputs and plays the adjusted audio signals through the sound playing device 106 as sound.

In this embodiment, the audio file is divided into a plurality of audio frames in units of 2048 samples, and the portable device 100 performs fast Fourier transform on each audio frame. Such transform converts the audio signals from the original domain to the frequency domain, multiples the converted audio frame by the first adjustment coefficient of the corresponding frequency band, then performs an inverse Fourier transform to convert back to the time domain. The adjusted audio file is finally output through the sound playing device 106.

In this embodiment, the steps S202 to S210 obtain the frequency response characteristics of the environment in which the portable device 100 is placed. In another embodiment, in order to avoid excessive power consumption caused by frequent repetition of these steps, trigger conditions may be added to the process to reduce power consumption of the portable device 100. For example, the sensor data sent by the sensor of the portable device 100 can be used to determine whether the portable device 100 has been moved, whether the device 100 is moving or stationary, and, if now stationary, whether that state is maintained. If the portable device 100 is entirely stationary during a predefined period of time, it can be determined that the portable device 100 is in a static state. At this time, the portable device 100 can be triggered to perform the steps S202 to S210 to obtain the frequency response characteristic of the environment in which the portable device 100 is placed. The predefined period of time may be set by factory default, for example, the factory default value is one minute, or it may be set by the user through the user interface. In another embodiment, the trigger condition may also be a specific condition set by the user through the user interface.

Figure 5:
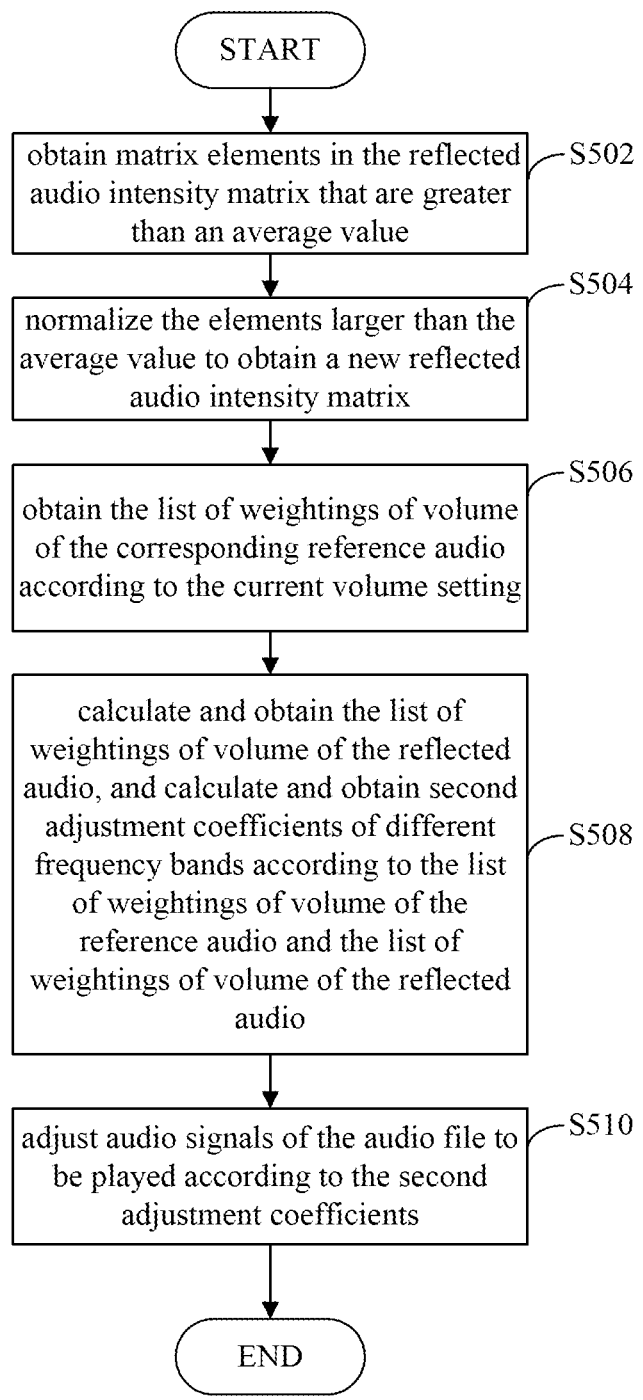
FIG. 5 is a flow chart of another embodiment of a method for adjusting output of sound.

In one embodiment, when the portable device 100 receives user command to increase the volume of sound, the portable device 100 may, instead of changing the current volume setting, adjust the intensity values of different frequency bands instead to obtain the required sound level while allowing a certain degree of distortion. The specific process steps are shown in FIG. 5.

Step S502, the portable device 100 obtains matrix elements in the reflected audio intensity matrix that are greater than an average value. The method for obtaining the reflected audio intensity matrix is as described in step S210. After calculating all the elements in the reflected audio intensity matrix to obtain the average value, all matrix elements greater than the average value are obtained.

Step S504, the portable device 100 normalizes the elements larger than the average value to obtain a new intensity matrix for reflected audio. That is to say, in the reflected audio intensity matrix, the intensity values of elements that are originally greater than the average value are strengthened to form the new audio intensity matrix for reflected sound.

Step S506, the portable device 100 obtains the list of weightings of volume of the corresponding reference audio according to the current volume setting.

Step S508, the portable device 100 calculates and obtains the list of weightings of volume of the reflected audio and calculates and obtains second adjustment coefficients of different frequency bands according to the lists of weightings of volume of the reference audio signals and of the reflected audio. The specific calculation method of the second adjustment coefficient is the same as that in step S210.

Step S510, the portable device 100 adjusts audio signals of the audio file to be played according to the second adjustment coefficients. The specific adjustment is the same as in step S212.

The method for adjusting sound playback and the portable device of the disclosure detect the frequency response characteristics of the environment in which the portable device is placed before being commanded to playback sound. When there is an audio file needing to be played, the audio signals of each frequency band are fine-tuned to achieve an unchanging sound volume, which saves the power consumption of the portable device. When the user wants to increase the volume of sound, the maximum volume can be achieved by adjusting the audio signals according to the detected frequency response characteristics, albeit at the cost of some distortion.

The embodiments shown and described above are only examples. Many details are often found in the art such as the other features of the portable device 100. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for adjusting sound playback applied in a portable device, the method comprising:
   determining whether the portable device is in a sound playing state;
   playing detectable audio by a sound playing device of the portable device when it is determined that the portable device is not in a sound playing state;
   receiving reflected audio by a sound receiving device of the portable device;
   calculating first adjustment coefficients of different frequency bands according to reference audio and the reflected audio;
   receiving an audio file;
   adjusting audio signals of the audio file according to the first adjustment coefficients; and
   playing an adjusted audio file by the sound playing device.

2. The method of claim 1, wherein the detectable audio comprise n groups of triangular waveforms, and fundamental frequencies of each of the n groups of the triangular waveforms are preset to increase gradually from 20 Hz to 770 Hz.

3. The method of claim 2, wherein the method further comprises:
adjusting a sound pressure level of each of the triangular waveforms according to audible thresholds in contours of equal loudness.

4. The method of claim 2, wherein the method further comprises:
calculating a audio intensity matrix of the reflected audio according to amplitudes of the fundamental frequencies of the detectable audio; and
calculating a list of weightings of volume of the reflected audio according to the audio intensity matrix and the detectable audio.

5. A portable device for adjusting sound playback, the portable device comprising:
a sound playing device;
a sound receiving device;
a processor; and
a memory for storing at least one computer program, wherein the at least one computer program comprises instructions which are executed by the processor, and performs a method comprising:
determining whether the portable device is in a sound playing state;
playing detectable audio by the sound playing device when it is determined that the portable device is not in a sound playing state;
receiving reflected audio by a sound receiving device;
calculating first adjustment coefficients of different frequency bands according to reference audio and the reflected audio;
receiving an audio file;
adjusting playing audio signals of the audio file according to the first adjustment coefficients; and
playing an adjusted audio file by sound playing device after adjustment.

6. The portable device of claim 5, wherein the detectable audio comprises n groups of triangular waveforms, and fundamental frequencies of each of the n groups of the triangular waveforms are preset to increase gradually from 20 Hz to 770 Hz.

7. The portable device of claim 6, wherein the processor is further instructed to:
adjusting a sound pressure level of each of the triangular waveforms according to audible thresholds of contours of equal loudness.

8. The portable device of claim 6, wherein the processor is further instructed to:
calculating an audio intensity matrix of the reflected audio according to amplitudes of the fundamental frequencies of the detectable audio;
calculating a list of weightings of volume of the reflected audio according to the audio intensity matrix and the detectable audio.

\* \* \* \* \*